United States Patent [19]

Ogihara

[11] Patent Number: 5,475,646
[45] Date of Patent: Dec. 12, 1995

[54] SCREENING CIRCUITRY FOR A DYNAMIC RANDOM ACCESS MEMORY

[75] Inventor: Masaki Ogihara, Yokohama, Japan

[73] Assignee: Kabushiki Kaisha Toshiba, Japan

[21] Appl. No.: 342,000

[22] Filed: Nov. 16, 1994

Related U.S. Application Data

[63] Continuation of Ser. No. 112,202, Aug. 26, 1993, abandoned.

[30] Foreign Application Priority Data

Aug. 31, 1992 [JP] Japan ..................... 4-230692

[51] Int. Cl.$^6$ ..................................... G11C 7/00
[52] U.S. Cl. ................ 365/222; 365/189.09; 365/193; 365/201; 365/230.03; 365/233
[58] Field of Search ................ 365/189.09, 201, 365/193, 222, 233, 230.03

[56] References Cited

U.S. PATENT DOCUMENTS

| | | | |
|---|---|---|---|
| 4,811,299 | 3/1989 | Miyazawa et al. | 365/201 |
| 4,943,949 | 7/1990 | Yamaguchi et al. | 365/149 |
| 4,992,985 | 2/1991 | Miyazawa et al. | 365/201 |
| 5,111,433 | 5/1992 | Miyamoto | 365/195 |
| 5,119,337 | 6/1992 | Shimizu et al. | 365/201 |
| 5,343,430 | 8/1994 | Furuyama | 365/201 |

FOREIGN PATENT DOCUMENTS 3903714 9/1989 Germany.
WO82/00917 3/1982 WIPO.

Primary Examiner—David C. Nelms
Assistant Examiner—F. Niranjan
Attorney, Agent, or Firm—Banner & Allegretti, Ltd.

[57] ABSTRACT

A dynamic random access memory comprising a dynamic memory section, a first screening-test pad, a second screening-test pad, and a mode-setting circuit. The dynamic memory section includes a memory-cell array having dynamic-type memory cells (MC) arranged in rows and columns, a row circuit and a column circuit, both connected to the memory-cell array, and a refresh counter for generating a refresh address signal for refreshing the dynamic-type memory cells when the dynamic memory section is set in a CBR refresh mode. The first screening-test pad receives a first external control signal for setting the dynamic memory section in an ordinary mode or a screening-test mode. The second screening-test pad receives a second external control signal for setting the dynamic memory section in the CBR refresh mode. The mode-setting circuit detects whether or not the first control signal and the second external control signal are in predetermined states, and enables the row circuit and the column circuit upon detecting that the first and second control signals are in the predetermined states, thereby to cause the refresh counter to supply the refresh address signal to the row circuit and the column circuit.

20 Claims, 8 Drawing Sheets

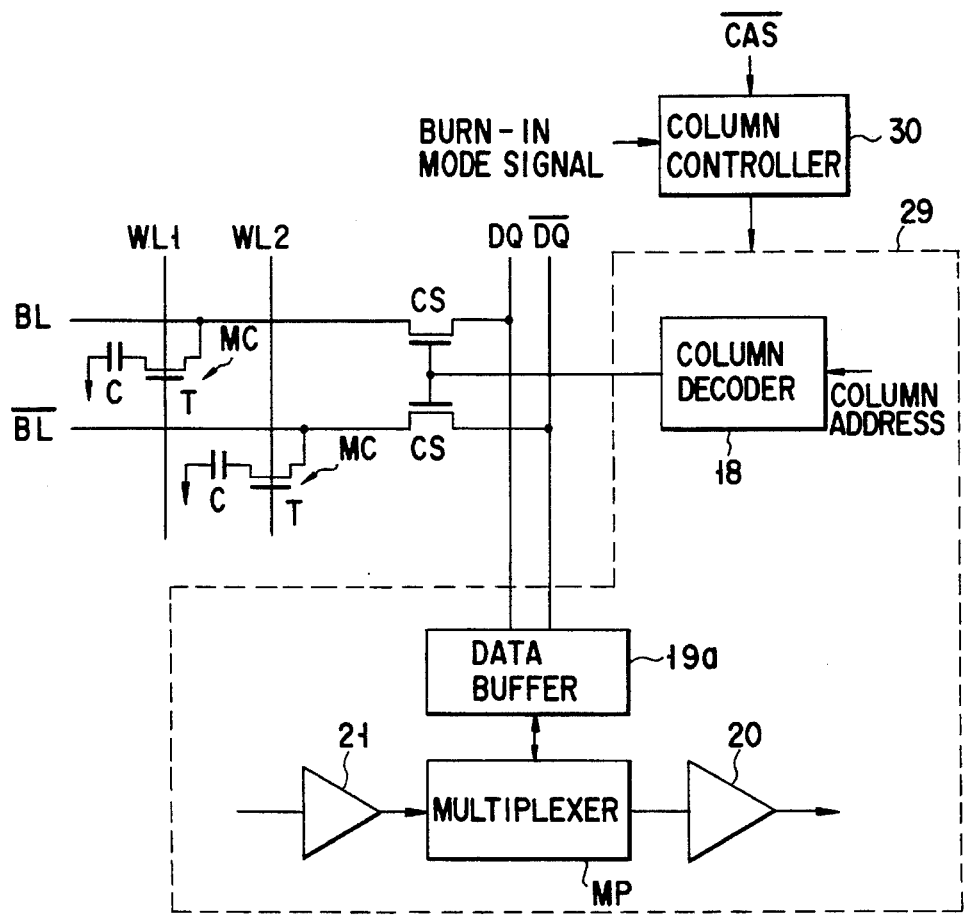
F I G. 2
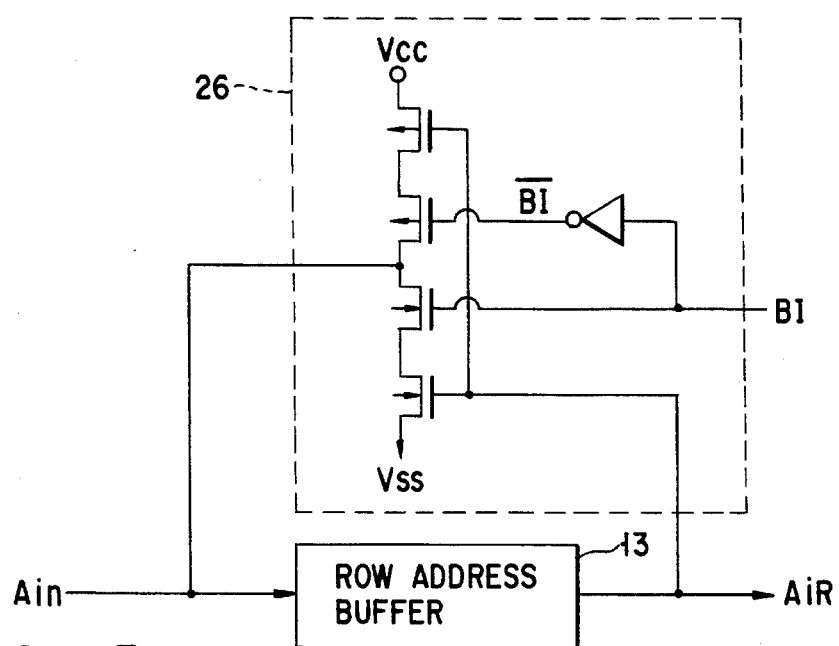
F I G. 3

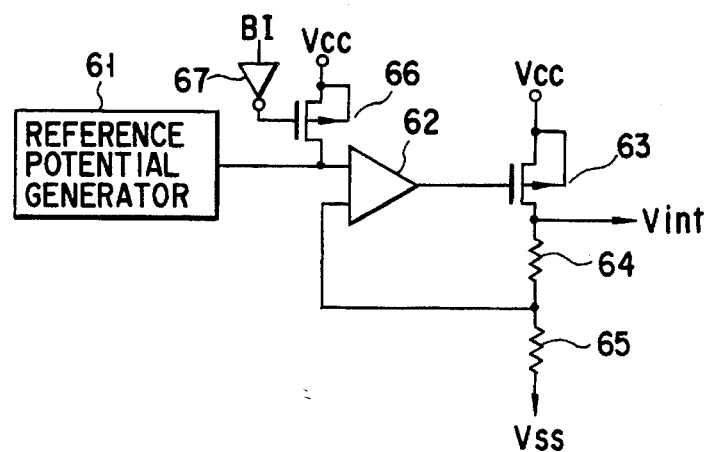
F I G. 11
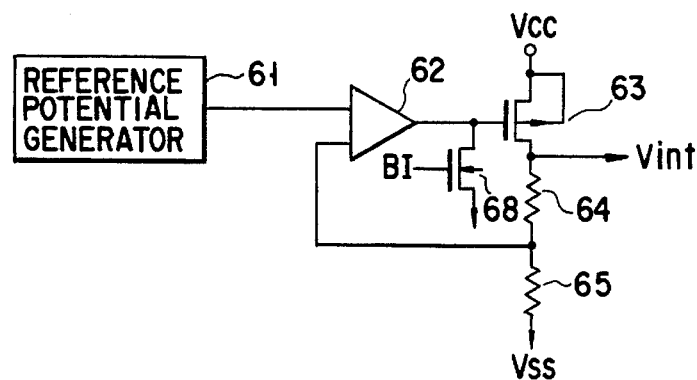
F I G. 12
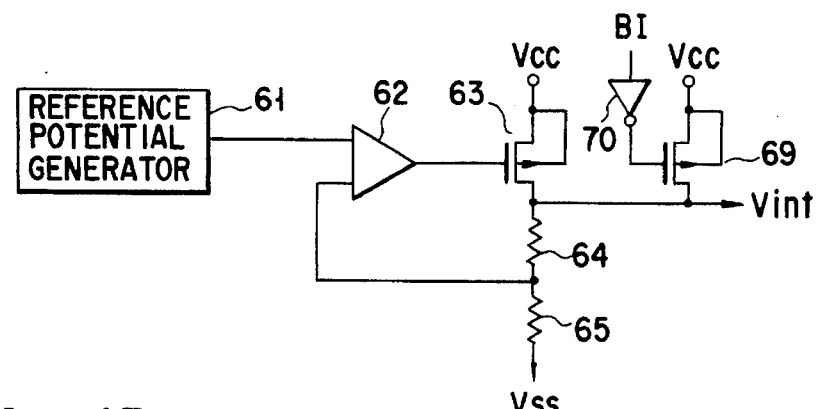
F I G. 13

5,475,646

SCREENING CIRCUITRY FOR A DYNAMIC RANDOM ACCESS MEMORY

This application is a continuation of application Ser. No. 08/112,202, filed Aug. 26, 1993, now abandoned.

BACKGROUND OF THE INVENTION

1. Field of the Invention

The present invention relates to a dynamic random access memory (DRAM) which has a voltage-stress applying circuit.

2. Description of the Related Art

Generally, semiconductor devices are subjected to screening before they are delivered from the factory to customers, so that only those found reliable may be supplied to the customers. In the screening, the devices are tested for latent defects which they may have, without being made defective or having their characteristics deteriorated. More specifically, a relatively high voltage is applied on each device for a short time. This voltage applied to is higher than the voltage to the device during normal use thereof. Hence, the device receives, within the short time, a stress which is greater than the stress it may receive during its early failure period. It is then determined whether or not the device can withstand the stress. If the device fails to withstand the stress, it will not be delivered from the factory. Thus, only the devices found to have withstood the stress are considered reliable and subsequently supplied to the customers.

In an early developed DRAM, an external clock-refresh signal is supplied from the refresh terminal to the refresh counter in order to effect refreshing during the ordinary operation of the DRAM. PCT International Publication Number WO 82/00917, US80/01149 (international publication date: Mar. 18, 1982), "Tape Burn-in Circuit" discloses a refreshing technique applicable to this type of a DRAM. In this technique, a burn-in signal is input to the DRAM through the wires embedded in an external tape, and a clock refresh signal is simultaneously supplied via the refresh terminal to the refresh counter. As a result, the row circuit and the column circuit are activated, and the refresh counter is actuated to output a signal to both the row decoder circuit and the column decoder circuit. Four terminals are required to perform the burn-in operation on the DRAM. They are: a power-supply terminal, a ground terminal, a burn-in mode terminal, and a refresh terminal.

The more storage capacity a DRAM has, the more terminals it has. To reduce the number of terminals, the refresh terminal, which is used to input an external clock refresh signal, is dispensed with. In this case, no refresh signal is supplied to the DRAM. Rather, the DRAM is set into a CBR refresh mode to be refreshed during its ordinary operation. While the DRAM remains in the CBR refresh mode, a $\overline{CAS}$ signal and a $\overline{RAS}$ signal are sequentially input to the DRAM through the CAS terminal and the RAS terminal, respectively, whereby a clock signal internal of the DRAM is supplied to the the refresh counter, the output of which is used as a refresh address.

Hitherto, screening is conducted on a packaged CBR-refresh mode DRAM in the following method. First, external address signals are sequentially supplied to the respective address signal terminals of the DRAM, thereby accessing the word lines of the DRAM one after another. To perform this method, the DRAM needs to have a large number of input pads, and a screening apparatus, generally known as a "prober," must be used which has an address signal generator for generating many address signals to supply to the input pads of the DRAM.

The screening method may be conducted on DRAM chips formed in a semiconductor wafer. In this case, the terminals of the prober are set into contact with the address signal pads of one DRAM chip, and address signals are sequentially supplied through the proper terminals to the respective input pads, thereby to sequentially access the word lines of the DRAM chip. To enhance the efficiency of the screening, it is desirable that the prober have many terminals so that it may supply address signals to the address signal pads of several DRAM chips at a time. (Most desirably, the prober should have as many terminals as all address signal pads on the wafer.) As a matter of fact, however, it is difficult to manufacture a prober which has a probe card with so many a terminal. Another problem is that the prober needs to incorporate an address signal generator.

To solve these problems, a screening method has been developed, which is disclosed in U.S. patent application No. 07/695,014 (filed based on Japanese Patent Application No. 2-119949). In this method, a single screening-test pad is formed on a CBR-refresh mode DRAM, and a $\overline{CAS}$ signal and a $\overline{RAS}$ signal are sequentially input to the DRAM while externally supplying a screening-test mode signal to the screening-test pad, thereby to activate the refresh counter, the row circuit and the column circuit, and the output of the refresh counter is simultaneously supplied to the row address buffer and the column address buffer.

With this method it is unnecessary to sequentially supply external address signals to the DRAM to conduct a screening test on the DRAM. Thus, the DRAM needs only five terminals, i.e., a power-supply terminal, a ground terminal, a screen-test mode terminal, a $\overline{CAS}$ terminal, and a $\overline{RAS}$ terminal. However, it is demanded that the number of input pads which a DRAM chip must have to undergo screening be reduced as much as possible in order to further enhance the screening efficiency.

SUMMARY OF THE INVENTION

Accordingly it is an object of this invention to provide a DRAM which has a relatively small number of input pads for use in the screening of the DRAM, and which therefore helps to reduce the number of terminals a prober needs to have for screening each of DRAM chips formed in a semiconductor wafer and also serves to enhance the efficiency of the screening.

To achieve the object, according to the invention there is provided a DRAM comprising: a dynamic memory section including a memory-cell array having dynamic-type memory cells arranged in rows and columns, a row circuit and a column circuit, both connected to the memory-cell array, and a refresh counter for generating a refresh address signal for refreshing the dynamic-type memory cells when said dynamic memory section is set in a CBR refresh mode; a first screening-test pad for receiving a first external control signal for setting the dynamic memory section in an ordinary mode or a screening mode; a second screening-test pad for receiving a second external control signal for setting the dynamic memory section in the CBR refresh mode; and a mode-setting circuit for detecting whether or not the first control signal and the second external control signal are in predetermined states, and for enabling the row circuit and the column circuit upon detecting that the first and second control signals are in the predetermined states, thereby to cause the refresh counter to supply the refresh address signal to the row circuit and the column circuit.

Since the control signals are supplied externally, refresh address signals need not be supplied externally. A screening test stress can be applied on the dynamic memory section, virtually without loss. The number of input pads required to conduct screening on the DRAM is therefore small. Hence, a prober and a probe card, both for use in the screening of identical DRAM chips on a wafer, need to have a small number of terminals for each of the DRAM chips.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a diagram illustrating a part of the DRAM shown in FIG. 1;

FIG. 3 is a diagram showing one of the 1-bit sections of the address switch circuit incorporated in the DRAM;

FIG. 11 is a diagram showing the power-supply voltage lowering circuit and the control circuit for stopping the lowering of the power-supply voltage, both incorporated in the DRAM of FIG. 1;

FIG. 12 is a diagram illustrating another type of a power-supply voltage lowering circuit and a control circuit, which may be used in place of those shown in FIG. 11;

FIG. 13 is a diagram showing still another type of a power-supply voltage lowering circuit and a control circuit, which may be used in place of those shown in FIG. 11;

DETAILED DESCRIPTION OF THE PREFERRED EMBODIMENTS

Several embodiments of the present invention will be described in the following, with reference to the accompanying drawings. Each component commonly used in the embodiments will be denoted at the same numeral in every drawing, and will not be repeatedly described in the following.

Figure 1:
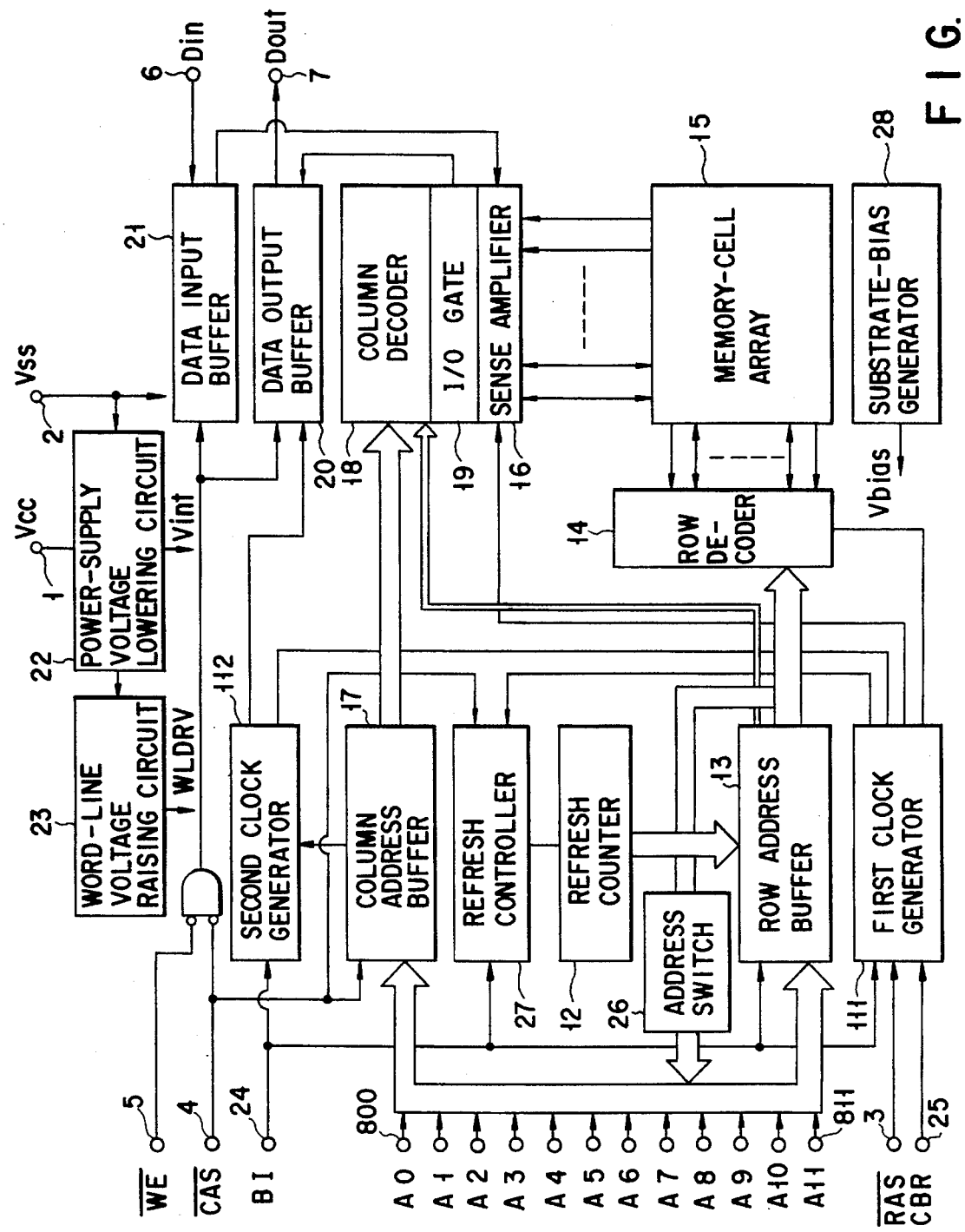
FIG. 1 is a block diagram showing a DRAM according to a first embodiment of the present invention.

FIG. 1 shows, in detail, a first embodiment of the invention, which is a DRAM which is of 16 m×1 bit configuration.

As illustrated in FIG. 1, the DRAM has a power-supply terminal 1, a ground terminal 2, a RAS terminal 3, a CAS terminal 4, and a WE terminal 5. A power-supply potential is externally applied to the terminal 1. A ground potential is externally applied to the terminal 2. A $\overline{RAS}$ (Row Address Strobe) signal is externally input to the RAS terminal 3. A CAS (Column Address Strobe) signal is externally input to the $\overline{CAS}$ terminal 4. A $\overline{WE}$ (Write Enable) signal is externally input to the WE terminal 5. The DRAM also has a data input terminal 6, a data output terminal 7, and a plurality of address terminals 800 to 811. Data Din to be written into a memory array (later described) is externally input to the data input terminal 6. Data Dout read from the memory-cell array 15 is output through the data output terminal 7 to an external apparatus. Address signals A0 to A11 are externally supplied to the address terminals 800 to 811.

As shown in FIG. 1, the DRAM further comprises a refresh counter 12, a row address buffer 13, a row decoder 14, a memory-cell array 15, a sense amplifier 16, and two clock generators 111 and 112. The refresh counter 12 is designed to generate a refresh address signal. The row address buffer 13 is connected to receive row address signals included in the address signals A0 to A11 input to the address terminals 800 to 811, or the refresh address signal output from the refresh counter 12. The row decoder 14 is used to decode an output of the row address buffer 13. The memory-cell array 15 comprises a number of memory cells arranged in rows and columns. Any row of memory cells can be selected by the output of the row decoder 14. The sense amplifier 16 is connected to the memory-cell array 15, for detecting a read potential applied from the memory-cell array 15. The first clock generator 111 is designed to generate a first clock signal, and the second clock generator 112 to generate a second clock signal.

The DRAM further comprises a column address buffer 17, a column decoder 18, an I/O (Input/Output) gate 19, a data output buffer 20, and a data input buffer 21. The column address buffer 17 is designed to receive the column address signal included in the address signals A0 to A11 as input to the address terminals 800 to 811. The where "A11" is the eleventh of "A"; and the column decoder 18 is used to decode an output of the column address buffer 17. The I/O gate 19 is provided to receive data from, and supply data to, any column of memory cells that is selected by an output of the column decoder 18. The data output buffer 20 is designed to amplify the data read from the I/O gate 19 and output the data to the data output terminal 7. The data input buffer 21 is used to amplify the input data Din supplied to the data input terminal 6 and outputs this data to the I/O gate 19.

The DRAM further has a power-supply voltage lowering circuit 22 and a word-line voltage raising circuit 23. The circuit 22 is designed to lower the power-supply voltage Vcc of 5 V to, for example, 3 to 4 V, which is used as internal power-supply voltage Vint. The circuit 23 is designed to raise the internal power-supply voltage Vint output from the circuit 22 and generates a word-line drive voltage WLDRV, which is applied to the word-line driver (not shown) incorporated in the row decoder 14.

In the embodiment shown in FIG. 1, the internal power-supply voltage Vint is applied as operating voltage to all internal circuits except the word-line driver and the data output buffer 20. The operating voltage of the data output buffer 20 is the power-supply voltage Vcc.

The DRAM has two screening-test pads 24 and 25. To the first screening-test pad 24 a screening-test mode signal BI is externally supplied to switch the mode of the DRAM between an ordinary mode and a screening-test mode. (The screening-test mode is, for example, a burn-in test mode in which a voltage stress and a thermal stress are simultaneously applied on the DRAM.) To the second screening-test pad 25 a CBR (CAS Before RAS Refresh)-mode signal is supplied to initiate the screening test on the DRAM.

As shown in FIG. 1, an address switch 26 is connected between the output of the row address buffer 13 and the address terminals 800 to 811. The address switch 26 remains off while the DRAM is set in the ordinary mode, and is turned on when the DRAM is set into the screening-test mode. The DRAM also has a refresh controller 27 and a substrate-bias generator 28. The refresh controller 27 is provided for controlling the refreshing of the memory-cell array 15 during the ordinary DRAM operation. The substrate-bias generator 28 is designed to generate a bias potential Vbias, which is applied to the semiconductor substrate of the DRAM.

FIG. 2 illustrates a part of the DRAM shown in FIG. 1. Shown in this figure are: two of the memory cells MC of the array 15 which are arranged in rows and columns; two (WL1 and WL2) of the word lines incorporated in the memory-cell array 15; two bit lines BL and $\overline{BL}$ forming one of the bit line pairs built in the array 15, each for one column of memory cells; two column-switching transistors SC provided for the column of memory cells MC; and data lines DQ and $\overline{DQ}$ used commonly for a plurality of columns of memory cells. Each memory cell MC comprises a transistor T used as a transfer gate and a capacitor C used as a data storage element.

Shown in FIG. 2 are: the column decoder 18, a data buffer 19a incorporated in the I/O gate 19 and connected to the data lines DQ and $\overline{DQ}$, a multiplexer MP connected to the data buffer 19a, the data output buffer 20 connected to the multiplexer MP, and the data input buffer 21 connected to the multiplexer MP. These components 18, 19a, MP, 20, and 21 constitute a column circuit 29. Also shown in FIG. 2 is a column controller 30 for controlling the column circuit 29.

Referring back to FIG. 1, the row decoder 14, the memory-cell array 15, and the sense amplifier 16 constitute a part of a row circuit (not shown) which serves to control access to the rows of memory cells.

The address switch 26 (FIG. 1) has a plurality of 1-bit sections, each of which have the same structure shown in FIG. 3. As shown in FIG. 3, each 1-bit section of the switch 26 is connected between an output of the row address buffer 13 and one address terminal to which an address signal Ain is supplied. The 1-bit section is a clocked inverter circuit which receives an output signal AiR from the row address buffer 13 and which is controlled by the screen-test mode signal BI and a signal $\overline{BI}$ internally obtained by inverting the screen-test mode signal BI.

The DRAM further has a screening-mode setting circuit for setting the memory-cell array 15 into the screening-test mode in response to an output of the refresh counter 12. The screening-mode setting circuit is incorporated in, for example, the refresh controller 27 and has the structure shown in FIG. 4. The screening-mode setting circuit is designed to detect whether or not a screening-test mode signal BI and a CBR-mode signal are supplied to the first and second screening-test pads 24 and 25, respectively, and to set the DRAM into a screening-test mode waiting state, a screening-test read mode or a screening-test write mode in accordance with whether or not the signal BI and the CBR-mode signal are supplied to the pads 24 and 25.

Figure 4:
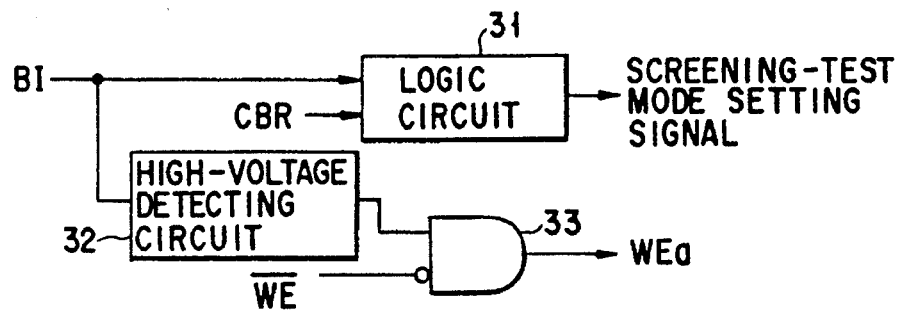
FIG. 4 is a diagram illustrating the mode-setting circuit included in the DRAM.

As shown in FIG. 4, the screening-mode setting circuit includes a logic circuit 31, a high-voltage detector 32, and an AND circuit 33. The logic circuit 31 has two input terminals. The first input terminal is connected to the first screening-test pad 24 to receive the screening-test mode signal BI. The second input terminal is connected to the second screening-test pad 25 to receive the CBR-mode signal. The circuit 31 generates a signal which is a logic sum of the screening-test mode signal BI and the CBR-mode signal and which sets the memory-cell array 15 into either the read mode or the waiting mode. The high-voltage detector 32 is connected to receive the screening-test mode signal BI and detect whether the level of the signal BI rises above the voltage which is applied to the DRAM in the ordinary mode. The AND circuit 33 produces a logic sum of the output of the high-voltage detector 32 and the signal $\overline{WE}$. The high-voltage detector 32 and the AND circuit 33 constitute an operation mode controller for generating a signal WEa which sets the DRAM into write mode.

Figure 5:
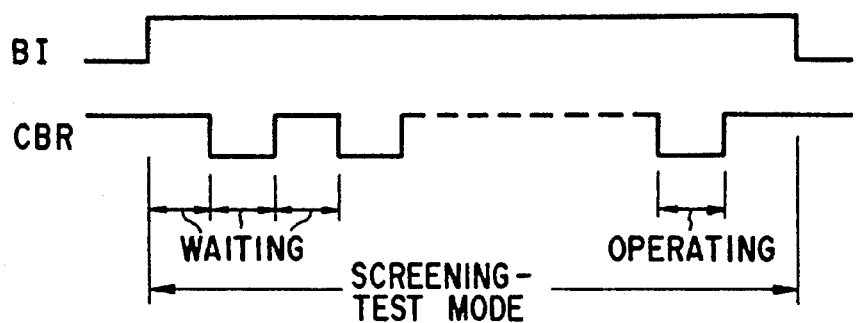
FIG. 5 is a timing chart for explaining how the mode-setting circuit sets the memory section of the DRAM.
Figure 6:
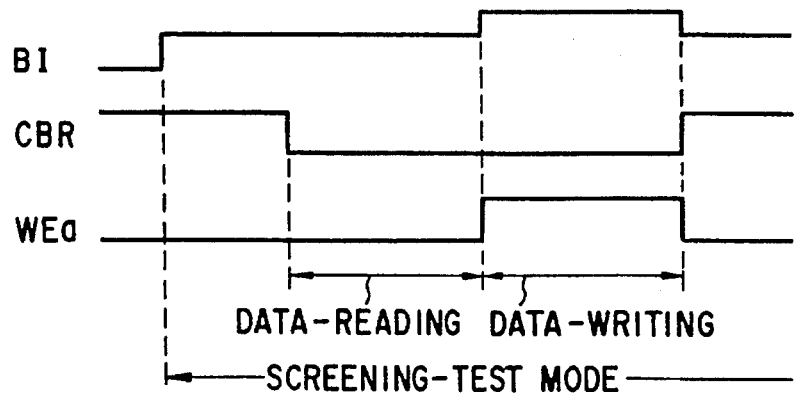
FIG. 6 is a timing chart for explaining a method how the mode-setting circuit sets the memory section in write mode.

FIG. 5 illustrates how the screening-mode setting circuit shown in FIG. 4 sets the DRAM into the screening-test mode, and FIG. 6 illustrates how the screening-test mode setting circuit sets the DRAM into the write mode.

The operation of the DRAM shown in FIG. 1 will now be explained, with reference to FIGS. 2 to 6.

Like the conventional standard DRAMs, this DRAM can operate in CBR mode so that the memory cells MC may be easily refreshed during the ordinary DRAM operation. It can operate in screening-test mode as well.

When the $\overline{CAS}$ signal and the $\overline{RAS}$ signal are sequentially enabled during the ordinary DRAM operation, the refresh controller 27 generates a CBR-mode signal. The refresh counter 12 and the circuit section including the row circuit (not shown) are thereby actuated, whereby a refresh address signal is supplied from the refresh counter 12 to the row address buffer 13. As a result, the memory cells MC of the array 15 are refreshed.

Also, during the ordinary DRAM operation, almost all circuits incorporated in the DRAM are driven by the internal power-supply voltage Vint obtained by lowering the power-supply voltage by means of the power-supply voltage lowering circuit 22, and the word-line drive voltage WLDRV obtained by raising the internal power-supply voltage Vint by the voltage raising circuit 23 is applied to the selected ones of the word lines of the memory-cell array 15.

When the logic circuit 31 of the screening-mode setting circuit shown in FIG. 4 detects that the screening-test mode signal BI supplied to the first screening-test pad 24 is at, for example, the high level, thus designating the screening-test mode, the screening-mode setting circuit sets the memory-cell array 15 into the screening-test mode. When the logic circuit 31 detects that the CBR-mode signal supplied to the second screening-test pad 25 is at, for example, the high level, the screening-mode setting circuit sets the memory-cell array 15 into waiting state.

Thereafter, when the logic circuit 31 detects that the CBR-mode signal has fallen to the low level, its output controls not only the refresh counter 12 and the circuit section including the row circuit (not shown), but also the column controller 30. The column controller 30 therefore actuates the column circuit 29. At the same time, the output of the logic circuit 31 turns on the address switch 26.

The memory-cell array 15 is thereby set into the read mode. The output of the refresh counter 12 is input to the row address buffer 13 and simultaneously input to the column address buffer 17 through the address switch 26. One of the word lines of the array 15 is thereby selected. The potentials of the memory cells connected to the selected word line are detected by the sense amplifier 16. The output of the sense amplifier 16 is read through the selected column-switching transistors SC.

Thereafter, when the logic circuit 31 detects that the CBR-mode signal has risen to the high level, the screening-mode setting circuit sets the memory-cell array 15 back into waiting state. As a result, the refresh counter 12 increases the refresh address by one. Then, the screening-mode setting circuit sets the memory-cell array 15 into the read mode again. This sequence of setting the array 15 into the waiting state and the read mode is repeated until the refresh address resume its original value. All word lines and all columns of the memory-cell array 15 are thereby accessed once.

Assume that the high-voltage detector 32 detects that the level of the signal BI rises above the voltage which is applied to the DRAM in the ordinary mode, while the memory-cell array 15 remains in both the screening-test mode and the read mode. Then, the AND circuit circuit 33 produces the logic sum of the signal $\overline{WE}$ and the output of the detector 32, i.e., a write-mode setting signal WEa. The write-mode setting signal WEa is supplied to the data input buffer 21, enabling this buffer 21. As a result, the memory-cell array 15 is set into the write mode.

Since the output of the refresh counter 12 is input to the row address buffer 13 and the column address buffer 17 at the same time in the screening-test mode. Hence, equal stresses are applied on the row circuit (not shown) and the column circuit 29 while the memory 10 cell array 15 remains in the screening-test mode. In other words, the array 15 can be set into the screening-test mode, merely by supplying a screening-test mode signal BI and a CBR-mode signal to the DRAM chip before the DRAM chip is cut from the wafer.

Thus, the word lines and the bit lines of the memory-cell array 15 are sequentially accessed without inputting a refresh address from outside the DRAM chip. A stress is thereby applied on all word lines and all bit lines of the array 15, to thereby to accomplish a screening test on the DRAM chip.

The number of input pads (or signals) required to conduct a screening test on the DRAM is relatively small. Further, the screening apparatus does not require an address signal generator to conduct screening on the DRAM of this invention.

Also, the number of terminals which a prober needs to have to test each DRAM chip formed in a wafer is small. Hence, the probe card of the prober only needs to have a relatively small number of terminals. This makes it easier to manufacture the probe card and makes it possible to conduct screening with high efficiency. Moreover, the prober need not be equipped with an address signal generator in order to conduct screening on the DRAM of this invention.

The two pads 24 and 25 provided for screening test only are not used when the DRAM is assembled into an apparatus. They can therefore assume any of the positions on the DRAM chip; they can be so positioned to allow easy access from the terminals of a prober card or can be positioned near the other pads of the DRAM (for example, along the shorter side of the DRAM chip). If so positioned, the pads 24 and 25 will help to enhance the efficiency of the screening test on the the DRAM chip.

Since the logic circuit 31 is located remote from the RAS terminal 3 and the CAS terminal 4, it adds no parasitic capacitance to the RAS terminal 3 or the CAS terminal 4.

In order to set the memory-cell array 15 into the screening-test mode, the address switch 26 is turned on, thereby to input the output signal of the row address buffer 13 to the column address buffer 17 via the address terminals 800 to 811. This simplifies the circuit configuration of the DRAM and makes it easy to arrange the wiring in the DRAM chip. An increase in the chip area can therefore be prevented.

Figure 7:
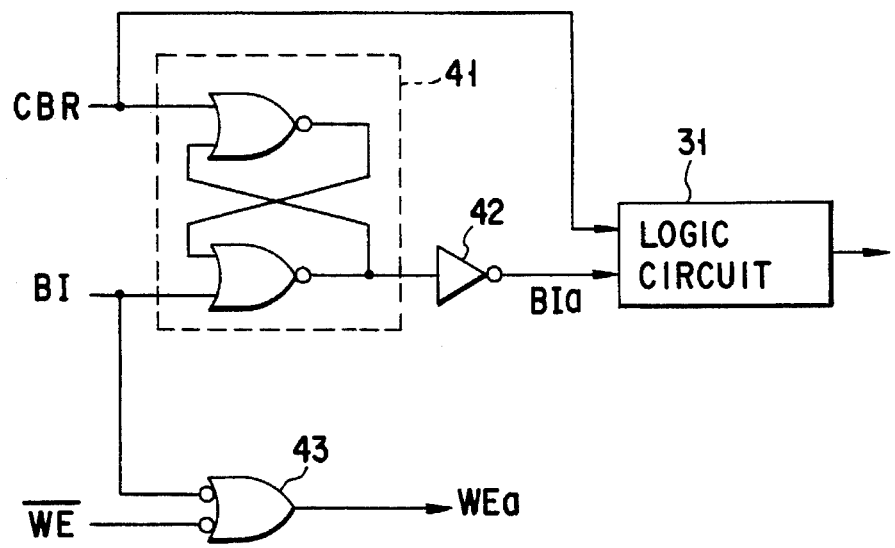
FIG. 7 is a diagram showing another type of a mode-setting circuit which may be incorporated in the DRAM of FIG. 1.

The mode-setting circuit shown in FIG. 4 may be replaced by another type which is illustrated in FIG. 7. The circuit of FIG. 7 comprises a logic circuit 31, a latch circuit 41, an inverter 42, and an AND circuit 43. The logic circuit 31 is identical to the one shown in FIG. 4. The latch circuit 41 latches a CBR-mode signal supplied to the second screening-test pad 25 when the screening-test mode signal BI supplied to the first screening-test pad 24 designates the screening-test mode. The inverter 42 inverts the output of the latch circuit 41 to output a screening-mode setting signal BIa. The AND circuit 43 produces a logic sum of the $\overline{WE}$ signal and the signal BI, thereby to generate a write-mode setting signal WEa.

Figure 8:
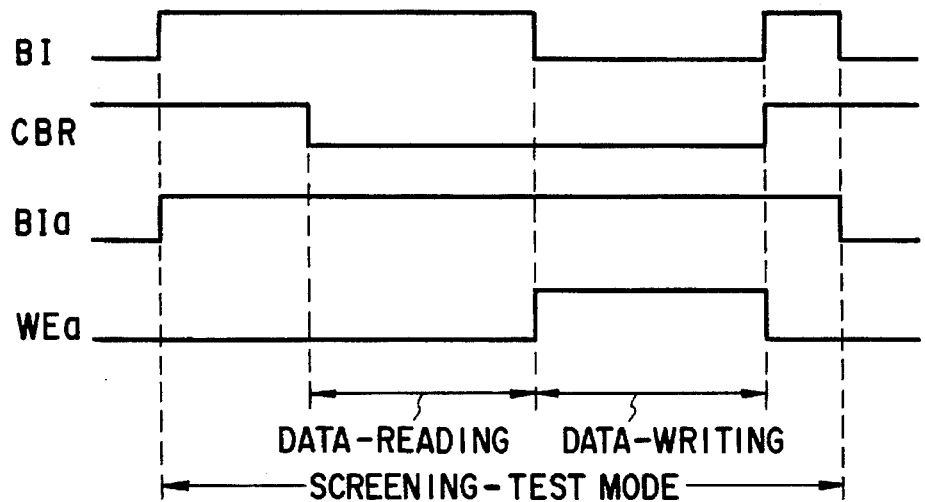
FIG. 8 is a timing chart for explaining another method how the mode-setting circuit sets the memory section in the write mode.

The operation of the circuit shown in FIG. 7 will be explained, with reference to the timing chart of FIG. 8. When the CBR-mode signal is input to the DRAM while the signal BI is designating the screening-test mode, the latches the CBR-mode signal and outputs a signal. This signal is inverted by the inverter 42 and used as an internal screening-mode setting signal BIa. When the CBR-mode signal falls to the low level, the logic circuit 31 detects this fact. Then, the output of the logic circuit 31 sets the memory-cell array 15 into the read mode so that data may be read from the array 15 in the screening-test mode. Thereafter, when the screening-test mode signal BI falls to the low level, the AND circuit 43 outputs a write-mode setting signal WEa which will enable the data input buffer 21.

While the memory-cell array 15 remains in the screening-test mode, data to be written into the array 15 may be supplied from an external device to the data input terminal 6. It is, however, desirable that an input-data generating circuit be formed in the DRAM chip in order to reduce the number of terminals required for screening. Hence, the DRAM shown in FIG. 1 has an input-data generating circuit which is illustrated in FIG. 9.

Figure 9:
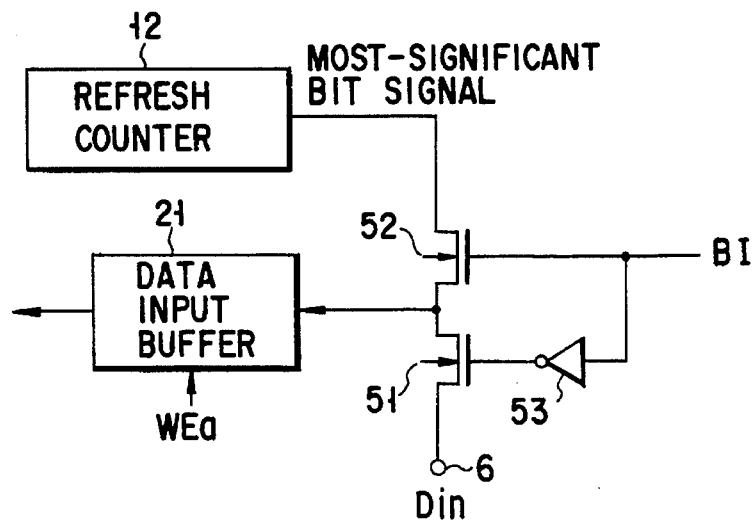
FIG. 9 is a diagram illustrating the input-data generating circuit incorporated in the DRAM of FIG. 1.

As shown in FIG. 9, the input-data generating circuit comprises two switching elements 51 and 52 and an inverter 53. The first switching element 51 is connected between the data input terminal 6 and the input node of the data input buffer 21. The second switching element 52 is connected between the input of the buffer 21 and the most-significant bit node of the refresh counter 12. The second switching element 52 is controlled by the screening-test mode signal BI, and the first switching element 51 is controlled by a signal $\overline{BI}$ which the inverter 53 generates by inverting the signal BI. Therefore, the first switching element 51 and the second switching element 52 are thereby turned on and off, respectively, while the memory-cell array 15 remains in the ordinary mode, and are turned off and on, respectively, while the memory-cell array 15 remains in the screening-test mode.

Hence, when the memory-cell array 15 is in the screening-test mode, the most significant address bit output from the refresh counter 12 can be stored into the data-input buffer 21.

In other words, the refresh counter 12 can be used as an input-data generating circuit which inverts its output data every time it outputs the most significant bit of the address data.

Figure 10:
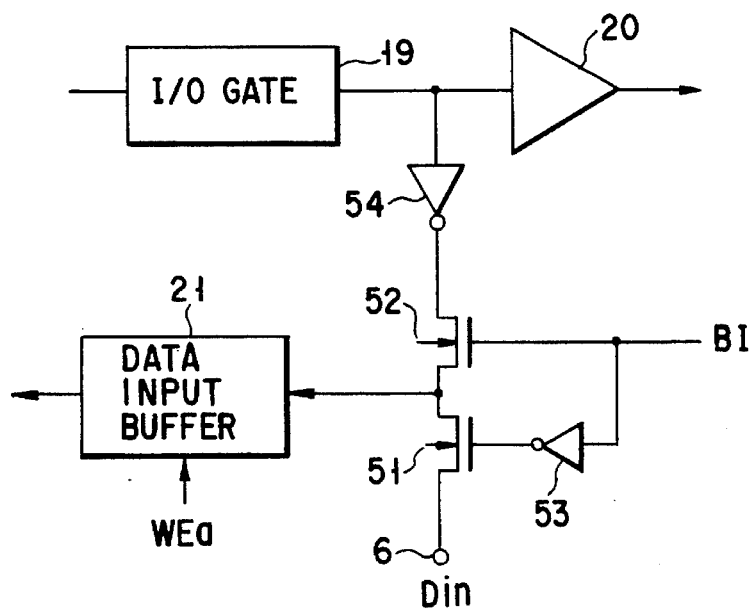
FIG. 10 is a diagram showing another type of an input-data generating circuit which may be used in place of the circuit shown in FIG. 9.

FIG. 10 shows another type of an input-data generating circuit which may be used the DRAM instead of the circuit shown in FIG. 9.

As clearly seen from FIG. 10, this input-data generating circuit comprises two first switching elements 51 and 52 and two inverters 53 and 54. The first switching element 51 is connected between the data input terminal 6 and the input node of the data input buffer 21. The second switching element 52 and the second inverter 54 are connected in series between the I/O gate 19 and the input node of the data-input buffer 21. The second switching element 52 is controlled by the screening-test mode signal BI, and the first switching element 51 is controlled by a signal $\overline{BI}$ which the first inverter 53 generates by inverting the signal BI. Thus, the first switching element 51 and the second switching element 52 are thereby turned on and off, respectively, while the memory-cell array 15 remains in the ordinary mode, and are turned off and on, respectively, while the memory-cell array 15 remains in the screening-test mode.

In operation, when the memory-cell array 15 is in the screening-test mode, the data output from the I/O gate 19 and inverted by the second inverter 54 can be stored into the data-input buffer 21. This input-data generating circuit is also simple in structure.

The screening-mode setting circuit, either the one of FIG. 4 or FIG. 7, may be controlled to prohibit the power-supply voltage lowering circuit 22 from lowering the power-supply voltage—at the time of setting the memory-cell array 15 into the screening-test mode. If the screening-mode setting circuit is so controlled, the internal power-supply voltage Vint can be higher than when the memory-cell array 15 is in the ordinary mode, making it possible to enhance the efficiency of screening.

FIGS. 11, 12, and 13 show three types of a circuit unit which comprises a power-supply voltage lowering circuit and a control circuit for controlling the voltage lowering circuit—all types being for use in the DRAM of FIG. 1.

The power-supply voltage lowering circuit of the circuit unit of FIG. 11 comprises a reference potential generator 61, a differential circuit 62, a PMOS transistor 63, and two resistors 64 and 65. The differential circuit 62 is connected at its first input node to the output node of the reference potential generator 61. The PMOS transistor 63 has its gate connected to the output node of the differential circuit 62, and its source connected to the Vcc node. The resistors 64 and 65 are connected in series between the Vss node and the drain (i.e., the node for outputting the internal power-supply voltage Vint) of the PMOS transistor 63. The node of the resistors 64 and 65 is connected to the second input node of the differential circuit 62.

As is shown in FIG. 11, the control circuit for controlling the voltage lowering circuit comprises a PMOS transistor 66 and an inverter 67. The PMOS transistor 66 has its source connected to the Vcc node and the substrate of the PMOS transistor 54, and its drain connected to the output node of the reference potential generator 61. The inverter 67 receives and inverts the screening-test mode signal BI to a signal $\overline{IB}$, which is supplied to the gate of the PMOS transistor 66.

The operation of the circuit unit shown in FIG. 11 will be explained. While the DRAM is operating in the ordinary mode, the PMOS transistor 66 remains off, and the PMOS transistor 63 is switched by the output of the differential circuit 62 to maintain the internal power-supply voltage Vint at a constant value. On the other hand, while the DRAM is operating in the screening-test mode, the PMOS transistor 66 remains on, and the first input node of the differential circuit 62 is fixed at the Vcc potential. The PMOS transistor 63 therefore remains on, and the internal power-supply voltage Vint is fixed at the Vcc potential.

The circuit unit of FIG. 12 will be described. As is evident from FIG. 12, the voltage lowering circuit used in this circuit unit is identical to the one shown in FIG. 11. The control circuit for controlling the voltage lowering circuit comprises an NMOS transistor 68 whose drain-source path is connected between the Vss node and the output node of the differential circuit 62 and whose gate is connected to receive the screening-test mode signal BI.

The operation of the circuit unit shown in FIG. 12 will be explained. While the DRAM is operating in the ordinary mode, the NMOS transistor 68 remains off, and the PMOS transistor 63 is switched by the output of the differential circuit 62 to maintain the internal power-supply voltage Vint at a constant value. On the other hand, while the DRAM is operating in the screening-test mode, the NMOS transistor 68 remains on, and the output node of the differential circuit 62 is fixed at the Vss potential. The PMOS transistor 63 is thereby made to remain on, and the internal power-supply voltage Vint is fixed at the Vcc value.

The circuit unit of FIG. 13 will be described. AS can be understood from FIG. 13, the voltage lowering circuit used in this circuit unit is identical to the one shown in FIG. 11. The control circuit for controlling the voltage lowering circuit comprises a PMOS transistor 69 and an inverter 70. The PMOS transistor 69 has its source-substrate path connected to the Vcc node, and its drain connected to the drain of the PMOS transistor 63. The inverter 70 receives and inverts the screening-test mode signal BI to a signal $\overline{IB}$, which is supplied to the gate of the PMOS transistor 69.

The operation of the circuit unit shown in FIG. 13 will be explained while the DRAM is operating in the ordinary mode, the PMOS transistor 69 remains off, and the PMOS transistor 63 is switched by the output of the differential circuit 62 to maintain the internal power-supply voltage Vint at a constant value. On the other hand, while the DRAM is operating in the screening-test mode, the PMOS transistor 69 remains on, and the internal power-supply voltage is fixed at the Vcc value.

Figure 14:
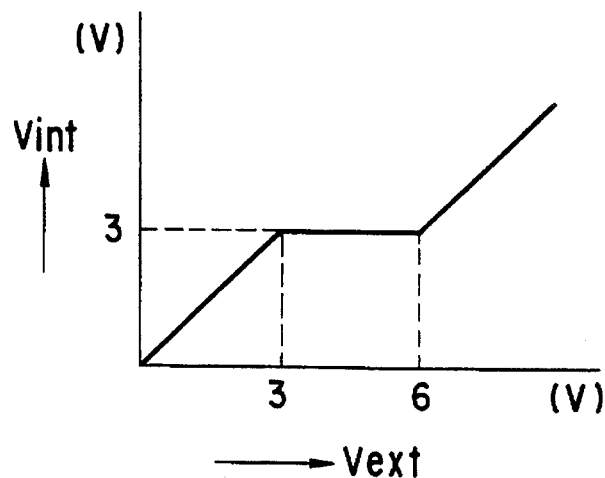
FIG. 14 is a diagram representing the characteristic which the power-supply voltage lowering circuit shown in FIG. 13 exhibits while lowering the power-supply voltage.

The characteristic the power-supply voltage lowering circuit shown in FIG. 13 exhibits while performing its function will be explained with reference to FIG. 14. When the external power-supply voltage Vext is less than 3 V or more than 6 V, the output voltage of the circuit, i.e., the internal power-supply voltage Vint, increases in proportion to the voltage vext. On the other hand, when the voltage vext ranges from 3 V to 6 V, the internal power-supply voltage Vint remains unchanged.

Figure 15:
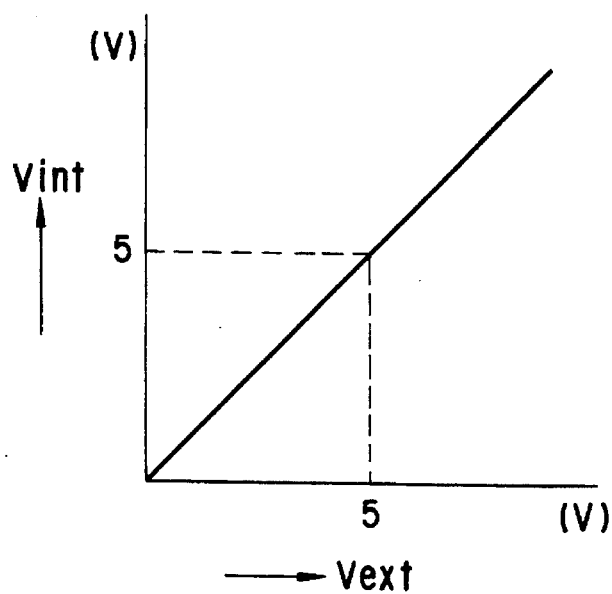
FIG. 15 is a diagram representing the characteristic which the power-supply voltage lowering circuit shown in FIG. 13 exhibits while not lowering the power-supply voltage.

The characteristic the power-supply voltage lowering circuit shown in FIG. 13 exhibits while being disabled to perform its function will be explained with reference to FIG. 15. While prohibited from effecting its function, the circuit generates an internal power-supply voltage Vint which linearly increases as does the external power-supply voltage Vext.

As has been described, the DRAM has the word-line voltage raising circuit 23 (see FIG. 1). The circuit 23 raises the internal power-supply voltage Vint and apply the raised voltage to the word lines selected while the DRAM is operating in the ordinary mode. Since the word lines are connected to the transfer gates of the memory cells MC and the transfer gages are coupled to the respective storage nodes of the cells MC, the charges in the storage nodes are increased to the internal power-supply voltage Vint. Here arises a problem.

Assume the MOS transistors serving as transfer gates of the cells MC have a gate insulating film of the same thickness as that of the MOS transistors incorporated in the peripheral circuits arranged near the memory-cell array 15. Then, if the potential on the word lines is higher than the potentials applied on the peripheral circuits, a more intense electric field will be applied on the MOS transistors than on the MOS of the peripheral circuits. The highest screening voltage that can be applied to the word lines is limited to one which is so low as not to destroy the transfer gates of the memory cells MC or break down the diffusion layers applied with the raised voltage. The intensity of the electric field generated from the screening voltage has but an intensity insufficient to achieve screening on the ordinary circuit elements which are not applied with the raised voltage. Consequently, it takes a long time to destroy defective ones, if any, of the ordinary circuit elements. In other words, since the screening voltage must be so low as not to destroy the elements of a circuit block, it would take a long time to perform successful screening on any other circuit blocks to which no raised voltage is applied.

This problem is solved by the screening-mode setting circuit. In the screening-test mode, the screening-mode setting circuit prohibits the word-line voltage raising circuit 23 from raising the internal power-supply voltage Vint. As a result, in the screening-test mode, the word-line drive voltage WLDRV can be fixed at the internal power-supply voltage Vint, whereas a voltage Vint is applied to the circuit elements other than the transfer gates.

Figure 16:
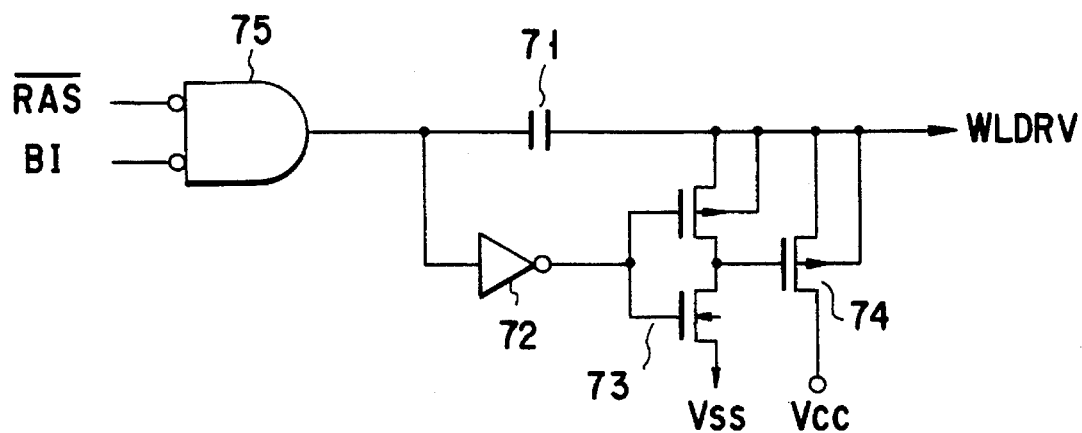
FIG. 16 is a diagram illustrating the word-line voltage raising circuit and the control circuit for stopping the lowering of the word-line voltage, both incorporated in the DRAM of FIG. 1.

FIG. 16 shows the word-line voltage raising circuit 23 and a control circuit for prohibiting the circuit 23 from raising the word-line voltage. As shown in FIG. 16, the circuit 23 comprises a boosting capacitor 71, an inverter 72, a CMOS inverter 73, and a PMOS transistor 74. The inverter 72 is connected at one input node to the first end of the booster capacitor 71. The CMOS inverter 73 is connected between the Vss node and the second end of the capacitor 71 (i.e., node for outputting the word-line drive voltage WLDRV), for receiving the output of the inverter 72. The PMOS transistor 74 has its gate coupled to the output node of the CMOS inverter 73, and its source-drain path connected between the Vcc node and the second end of the capacitor 71. The control circuit for controlling the circuit 23 comprises an NAND circuit 75 which has two input terminals for receiving the $\overline{RAS}$ signal and the screening-test mode signal BI, respectively. The output of the NAND circuit 75 is connected to the first end of the booster capacitor 71.

Figure 17:
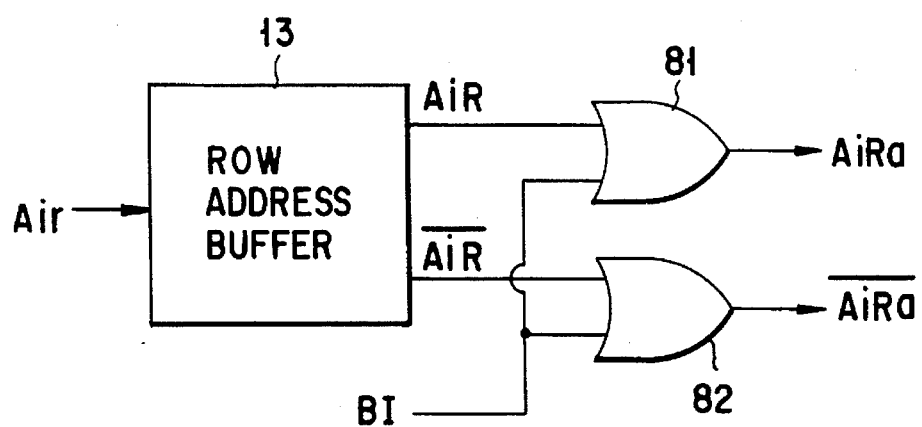
FIG. 17 is a diagram the cell-array block selecting circuit which may be incorporated in the DRAM of FIG. 1.

The memory-cell array 15 is divided into a plurality of cell-array blocks. More cell-array blocks may operate simultaneously in the screening-test mode than in the ordinary mode, under the control of the above-mentioned the screening-mode setting circuit, thereby to improve the screening efficiency. To this end, a cell-array block selecting circuit shown in FIG. 17 may be incorporated in the DRAM of FIG. 1. As shown in FIG. 17, the cell-array block selecting circuit comprises two OR gates 81 and 82. The OR gate 81 receives a cell-array block select signal AiR at its first input terminal from the row address buffer 13 and the screening-test mode signal BI at its second input terminal, and produces a cell-array block select signal AiRa. The OR gate 82 receives a cell-array block select signal $\overline{AiR}$ at its first input terminal from the row address buffer 13 and the screening-test mode signal BI at its second input terminal, and produces a cell-array block select signal $\overline{AiRa}$. The signals AiRa and $\overline{AiRa}$ are used to select any one of the cell-array blocks.

The present invention is not limited to the embodiments described above various changes and modification can be made, without departing the spirit and scope of the present invention.

What is claimed is:

1. A dynamic random access memory comprising:

a dynamic memory section including a memory-cell array having dynamic-type memory cells (MC) arranged in rows and columns, a row circuit and a column circuit, both connected to said memory-cell array, and a refresh counter for generating a refresh address signal for refreshing said dynamic-type memory cells when said dynamic memory section is set in a CBR (CAS before RAS) refresh mode;

a first screening-test pad for receiving a first external control signal for setting said dynamic memory section in one of an ordinary mode and a screening-test mode;

a second screening-test pad for receiving a second external control signal for setting said dynamic memory section in the CBR refresh mode; and a mode-setting circuit for detecting whether the first external control signal and the second external control signal are in predetermined states, and for enabling said row circuit and said column circuit upon detecting that the first and second control signals are in the predetermined states, thereby to cause said refresh counter to supply the refresh address signal to said row circuit and said column circuit, wherein said dynamic memory section further includes:

a power-supply terminal;

a ground terminal;

a plurality of address terminals for receiving an address signal supplied eternally;

a RAS terminal for receiving a RAS (row address strobe) signal supplied eternally;

a CAS terminal for receiving a CAS (column address strobe) signal supplied externally;

a WE terminal for receiving a write enable signal supplied externally;

a data output terminal for outputting data to an external device;

a data input terminal for receiving data to be written eternally;

a row address buffer for receiving a row address signal from one of said address terminals and an output from said refresh counter;

a row decoder for decoding the row address signal supplied from said row address buffer, thereby to select at least one of the rows of memory cells (MC);

a sense amplifier for detecting a potential read from said memory-cell array;

a column to address buffer for receiving a column address signal input from said address terminals;

a column decoder for decoding a column address signal supplied from said column address buffer, thereby to select at least one of the columns of memory cells (MC);

an input/output gate for supplying data to and receiving data from at least one selected column of memory cells (MC), in accordance an output from said column decoder;

a data output buffer for amplifying data read from said input/output gate and outputting the data to said data output terminal;

a data input buffer for amplifying data read from said data input terminal and outputting the data to said data input/output gate;

a control circuit for supplying the output of said refresh counter to said row address buffer when said CAS and RAS signals externally supplied to said CAS terminal and said RAS terminal, respectively, designate a CBR refresh mode, said mode-setting circuit generating a detection signal upon detecting that said first and second control signals are in predetermined states, thereby to enable said memory-cell array, said row address buffer, said row decoder, said sense amplifier, said column address buffer, said column decoder, said input/output gate, and said refresh counter, and supplying the output of said refresh counter to said row address buffer and said column address buffer, thereby to set said dynamic memory section into a screening-test mode, and a power-supply voltage lowering circuit for lowering a power-supply voltage applied from said power-supply terminal, thereby to generate an internal power-supply voltage, said mode-setting circuit prohibiting said power-supply lowering circuit from lowering the power-supply voltage when said dynamic memory section is set into the screening-test mode.

2. The dynamic random access memory according to claim 1, wherein said mode-setting circuit generates a detection signal upon detecting that the first control signal comes to have a level within a range different from a range in which the first control signal is used, after said dynamic memory section has been set into a screening-test mode, thereby to set said dynamic memory section into a write mode.

3. The dynamic random access memory according to claim 1, wherein said mode-setting circuit generates a detection signal upon detecting that the first control signal changes in level after said dynamic memory section has been set into a screening-test mode, thereby to set said dynamic memory section into a write mode.

4. The dynamic random access memory according to claim 2, wherein said mode-setting circuit controls said dynamic memory section such that said dynamic memory section receives the most significant bit output from said refresh counter as input data, while being set in the write mode.

5. The dynamic random access memory according to claim 3, wherein said mode-setting circuit controls said dynamic memory section such that said dynamic memory section receives the most significant bit output from said refresh counter as input data, while being set in the write mode.

6. The dynamic random access memory according to claim 2, wherein said mode-setting circuit controls said dynamic memory section such that said dynamic memory section receives, as input data, data obtained by inverting data supplied from said input/output gate, while being set in the write mode.

7. The dynamic random access memory according to claim 3, wherein said mode-setting circuit controls said dynamic memory section such that said dynamic memory section receives, as input data, data obtained by inverting data supplied from said input/output gate, while being set in the write mode.

8. A dynamic random access memory comprising:

a dynamic memory section including a memory-cell array having dynamic-type memory cells (MC) arranged in rows and columns, a row circuit and a column circuit, both connected to said memory-cell array, and a refresh counter for generating a refresh address signal for refreshing said dynamic-type memory cells when said dynamic memory section is set in a CBR (CAS before RAS) refresh mode;

a power-supply terminal;

a first screening-test pad for receiving a first external control signal for setting said dynamic memory section in an ordinary mode or a screening-test mode;

a second screening-test pad for receiving a second external control signal for setting said dynamic memory section in the CBR refresh mode; and a mode-setting circuit for detecting whether the first external control signal and the second external control signal are in predetermined states, for setting said dynamic memory section into a screening-test mode upon detecting that the first and second external control signals are in the predetermined states, and for enabling said row circuit and said column circuit upon detecting that the first and second external control signals are in the predetermined states, thereby to cause said refresh counter to supply the refresh address signal to said row circuit and the column circuit, wherein said dynamic memory section further has a power-supply voltage lowering circuit for lowering a power-supply voltage applied from said power-supply terminal, thereby to generate an internal power-supply voltage, and said mode-setting circuit prohibits said power-supply lowering circuit from lowering the power-supply voltage when said dynamic memory section is set into the screening-test mode.

9. The dynamic random access memory according to claim 8, wherein said dynamic memory section further has a voltage raising circuit for raising an internal power-supply voltage, thereby to generate a word-line driving voltage to be applied to said row decoder, and said mode-setting circuit prohibits said voltage raising circuit from raising the power-supply voltage, thereby to set the word-line driving voltage at the internal power-supply voltage, when said dynamic memory section is set into the screening-test mode.

10. The dynamic random access memory according to any one of claims 1 to 7, wherein said dynamic memory section further has an address switch circuit connected between an output node of said row address buffer and said address terminals, and said mode-setting circuit turns on said address switch circuit, thereby to set said dynamic memory section into the screening-test mode.

11. The dynamic random access memory according to claim 8, wherein:

said dynamic memory section further has a plurality of address terminals for receiving an address signal supplied eternally, a row address buffer for receiving a row address signal from said address terminals or an output from said refresh counter and an address switch circuit connected between an output node of said row address buffer and said address terminals; and said mode-setting circuit turns on said address switch circuit, thereby to set said dynamic memory section into the screening-test mode.

12. The dynamic random access memory according to claim 9, wherein: said dynamic memory section further has a plurality of address terminals for receiving an address signal supplied externally, a row address buffer for receiving a row address signal from said address terminals or an output from said refresh counter and an address switch circuit connected between an output node of said row address buffer and said address terminals; and said mode-setting circuit turns on said address switch circuit, thereby to set said dynamic memory section into the screening-test mode.

13. A dynamic random access memory comprising:

a dynamic memory section including a memory-cell array having dynamic-type memory cells (MC) arranged in rows and columns, a row circuit and a column circuit, both connected to said memory-cell array, and a refresh counter for generating a refresh address signal for refreshing said dynamic-type memory cells when said dynamic memory section is set in a CBR (CAS before RAS) refresh mode;

a first screening-test pad for receiving a first external control signal for setting said dynamic memory section in an ordinary mode or a screening-test mode;

a second screening-test pad for receiving a second external control signal for setting said dynamic memory section in the CBR refresh mode;

a mode-setting circuit for detecting whether the first external control signal and the second external control signals are in predetermined states, for setting said dynamic memory section into a screening-test mode upon detecting that the first and second external control signals are in the predetermined states, and for enabling said row circuit and column circuit upon detecting that the first and second external control signals are in the predetermined states, thereby to cause said refresh counter to supply the refresh address signal to said row circuit and said column circuit, wherein said dynamic memory section further includes:

a power-supply terminal;

a ground terminal;

a plurality of address terminals for receiving an address signal supplied externally;

a RAS terminal for receiving a RAS (row address strobe) signal supplied externally;

a CAS terminal for receiving a CAS (column address strobe) signal supplied externally;

a WE terminal for receiving a write enable signal supplied eternally;

a data output terminal for outputting data to an external device;

a data input terminal for receiving data to be written externally;

a row address buffer for receiving a row address signal from one of said address terminals and an output from said refresh counter;

a row decoder for decoding the row address signal supplied from said row address buffer, thereby to select at least one of the rows of memory cells (MC);

a sense amplifier for detecting a potential read from said memory-cell array;

a column address buffer for receiving a column address signal input from said address terminals;

a column decoder for decoding a column address signal supplied from said column address buffer, thereby to select at least one of the columns of memory cells (MC);

an input/output gate for supplying data to and receiving data from at least one selected column of memory cells (MC), in accordance with an output from said column decoder;

a data output buffer for amplifying data read from said input/output gate and outputting the data to said data output terminal;

a data input buffer for amplifying data read from said data input terminal and outputting the data to said data input/output gate;

a control circuit for supplying the output of said refresh counter to said row address buffer when said CAS and RAS signals externally supplied to said CAS terminal and said RAS terminal, respectively, designate a CBR refresh mode; and an address switch circuit connected between the output said row address buffer and said address terminals, said mode-setting circuit generating a detection signal upon detecting that said first and second control signals are in predetermined states and turning on said address switch circuit, thereby to enable said memory-cell array, said row address buffer, said row decoder, said sense amplifier, said column address buffer, said column decoder, said input/output gate, and said refresh counter, and supplying the output of said refresh counter to said row address buffer and said column address buffer through said address switch circuit, thereby to set said dynamic memory section into a screening-test mode.

14. The dynamic random access memory according to claim 13, wherein said mode-setting circuit generates a detection signal upon detecting that the first control signal comes to have a level within a range different from a range in which the first control signal is used, after said dynamic memory section has been set into a screening-test mode, thereby to set said dynamic memory section into a write mode.

15. The dynamic random access memory according to claim 13, wherein said mode-setting circuit generates a detection signal upon detecting that the first control signal changes in level after said dynamic memory section has been set into a screening-test mode, thereby to set said dynamic memory section into a write mode.

16. The dynamic random access memory according to claim 14, wherein said mode-setting circuit controls said dynamic memory section such that said dynamic memory section receives the most significant bit output from said refresh counter as input data, while being set in the write mode.

17. The dynamic random access memory according to claim 15, wherein said mode-setting circuit controls said dynamic memory section such that said dynamic memory section receives the most significant bit output from said refresh counter as input data, while being set in the write mode.

18. The dynamic random access memory according to claim 14, wherein said mode-setting circuit controls said dynamic memory section such that said dynamic memory section receives, as input data, data obtained by inverting data supplied from said input/output gate, while being set in the write mode.

19. The dynamic random access memory according to claim 15, wherein said mode-setting circuit controls said dynamic memory section such that said dynamic memory section receives, as input data, data obtained by inverting data supplied from said input/output gate, while being set in the write mode.

20. A dynamic random access memory comprising:

a dynamic memory section including a memory-cell array having dynamic-type memory cells (MC) arranged in rows and columns, a row circuit and a column circuit, both connected to said memory-cell array, and a refresh counter for generating a refresh address signal for refreshing said dynamic-type memory cells when said dynamic memory section is set in a CBR (CAS before RAS) refresh mode;

a first screening-test pad for receiving a first external control signal for setting said dynamic memory section in an ordinary mode or a screening-test mode;

a second screening-test pad for receiving a second external control signal for setting said dynamic memory section in the CBR refresh mode;

a mode-setting circuit for detecting whether the first external control signal and the second external control signal are in predetermined states, for setting said dynamic memory section into a screening-test mode upon detecting that the first and second external control signals are in the predetermined states, and for enabling said row circuit and column circuit upon detecting that the first and second external control signals are in the predetermined states, thereby to cause said refresh counter to supply the refresh address signal to said row circuit and said column circuit, wherein said dynamic memory section further includes:

a power-supply terminal;

a ground terminal;

a plurality of address terminals for receiving an address signal supplied eternally;

a RAS terminal for receiving a RAS (row address strobe) signal supplied eternally;

a CAS terminal for receiving a CAS (column address strobe) signal supplied eternally;

a WE terminal for receiving a write enable signal supplied externally;

a data output terminal for outputting data to an external device;

a data input terminal for giving data to be written externally;

a row address buffer for receiving a new address signal from one of said address terminals and an output from said refresh counter;

a row decoder for decoding the row address signal supplied from said row address buffer, thereby to select at least one of the rows of memory cells (MC);

a sense amplifier for detecting a potential read from said memory-cell array;

a column address buffer for receiving a column address signal input from said address terminals;

a column decoder for decoding a column address signal supplied from said column address buffer, thereby to select at least one of the columns of memory cells (MC);

an input/output gate for supplying data to and receiving data from at least one selected column of memory cells (MC), in accordance with an output from said column decoder;

a data output buffer for amplifying data read from said input/output gate and outputting the data to said data output terminal;

a data input buffer for amplifying data read from said data input terminal and outputting the data to said data input/output gate;

a control circuit for supplying the output of said refresh counter to said row address buffer when said CAS and RAS signals eternally supplied to said CAS terminal and said RAS terminal, respectively, designate a CBR refresh mode, said mode-setting circuit generating a detection signal upon detecting that said first and second control signals are in predetermined states, thereby to enable said memory-cell array, said row address buffer, said row decoder, said sense amplifier, said column address buffer, said column decoder, said input/output gate, and said refresh counter, and supplying the output of said refresh counter to said row address buffer and said column address buffer, thereby to set said dynamic memory section into a screening-test mode; and a power-supply voltage lowering circuit for lowering a power-supply voltage applied from said power-supply terminal, thereby to generate an internal power-supply voltage, said mode-setting circuit prohibiting said power-supply lowering circuit from lowering the power-supply voltage when said dynamic memory section is set into the screening-test mode.

* * * * *